United States Patent
Yu et al.

(10) Patent No.: US 10,658,613 B2
(45) Date of Patent: May 19, 2020

(54) ORGANIC LIGHT EMITTING DIODE ENCAPSULATION STRUCTURE, DISPLAY APPARATUS AND ENCAPSULATION METHOD OF ORGANIC LIGHT EMITTING DIODE

(71) Applicant: BOE TECHNOLOGY GROUP CO., LTD., Beijing (CN)

(72) Inventors: Donghui Yu, Beijing (CN); Wei Quan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/330,279

(22) PCT Filed: Jun. 1, 2018

(86) PCT No.: PCT/CN2018/089533
§ 371 (c)(1),
(2) Date: Mar. 4, 2019

(87) PCT Pub. No.: WO2019/011075
PCT Pub. Date: Jan. 17, 2019

(65) Prior Publication Data
US 2019/0207154 A1    Jul. 4, 2019

(30) Foreign Application Priority Data
Jul. 12, 2017 (CN) .......................... 2017 1 0566269

(51) Int. Cl.
*H01L 51/52* (2006.01)
*H01L 51/56* (2006.01)

(52) U.S. Cl.
CPC .......... *H01L 51/5246* (2013.01); *H01L 51/56* (2013.01)

(58) Field of Classification Search
CPC .... H01L 51/5246; H01L 51/525; H01L 51/56
See application file for complete search history.

(56) References Cited

U.S. PATENT DOCUMENTS 8,445,923 B2 * 5/2013 Lee ................... H01L 51/5237
257/88
2005/0264189 A1   12/2005 Choi et al.
(Continued)

FOREIGN PATENT DOCUMENTS

| CN | 1681360 A   | 10/2005 |
| CN | 104617234 A | 5/2015  |
| CN | 107316950 A | 11/2017 |

OTHER PUBLICATIONS

International Search Report of PCT/CN2018/089533 in Chinese, dated Sep. 7, 2018, with English translation.
(Continued)

*Primary Examiner* — Mariceli Santiago
(74) *Attorney, Agent, or Firm* — Collard & Roe, P.C.

(57) ABSTRACT

An encapsulation method of an organic light emitting diode, an organic light emitting diode encapsulation structure and an organic light emitting diode display apparatus are provided. The encapsulation method includes: providing an encapsulation cover plate and a base substrate with an organic light emitting diode device; forming a first sealant of the encapsulation cover plate, in which the first sealant includes a plurality of protrusion portions spaced apart with each other; forming a second sealant on the encapsulation cover plate, in which the second sealant includes a plurality of protrusion portions and a height of each of the plurality of protrusion portions of the second sealant is greater than a height of each of the plurality of protrusion portions of the first sealant; and bonding the encapsulation cover plate and
(Continued)

the base substrate, in which the second sealant covers the organic light emitting diode device and the first sealant.

20 Claims, 6 Drawing Sheets

(56) References Cited

U.S. PATENT DOCUMENTS

| | | | | |
|---|---|---|---|---|
| 2006/0202220 | A1* | 9/2006 | Hayashi | H01L 51/5246 257/98 |
| 2010/0140595 | A1* | 6/2010 | Lee | H01L 51/5246 257/40 |
| 2010/0171416 | A1* | 7/2010 | Lee | H01L 51/525 313/504 |
| 2015/0090991 | A1* | 4/2015 | Ishii | H01L 51/525 257/40 |
| 2016/0035996 | A1* | 2/2016 | Sun | H01L 21/77 257/40 |
| 2017/0250367 | A1* | 8/2017 | Yasukawa | H01L 27/326 |
| 2019/0207154 | A1 | 7/2019 | Yu et al. | |

OTHER PUBLICATIONS

Notice of Transmittal of the International Search Report of PCT/CN2018/089533 in Chinese, dated Sep. 7, 2018.
Written Opinion of the International Searching Authority of PCT/CN2018/089533 in Chinese, dated Sep. 7, 2018 with English translation.

* cited by examiner

ORGANIC LIGHT EMITTING DIODE ENCAPSULATION STRUCTURE, DISPLAY APPARATUS AND ENCAPSULATION METHOD OF ORGANIC LIGHT EMITTING DIODE

CROSS REFERENCE TO RELATED APPLICATIONS

This application is the National Stage of PCT/CN2018/089533 filed on Jun. 1, 2018, which claims priority under 35 U.S.C. § 119 of Chinese Application No. 201710566269.X filed on Jul. 12, 2017, the disclosure of which is incorporated by reference.

TECHNICAL FIELD

Embodiments of the present disclosure relate to an organic light emitting diode encapsulation structure, a display apparatus and an encapsulation method of an organic light emitting diode.

BACKGROUND

Organic light emitting diode (OLED) display technology attracts more and more attention. However, many organic materials are sensitive to moisture and oxygen and cannot endure a high temperature; in addition, oxidation of metal electrodes can also degrade performances of an organic light-emitting diode. Thus it is important to isolate the organic light-emitting diode from oxygen and water in order to prolong a lifetime of the organic light-emitting diode.

SUMMARY

At least one embodiment of the present disclosure provides an organic light emitting diode encapsulation structure, and the organic light emitting diode encapsulation structure comprises a base substrate, an encapsulation cover plate, a first sealant and a second sealant. The base substrate is provided with an organic light emitting diode device; the encapsulation cover plate is opposite to the base substrate; both the first sealant and the second sealant are between the encapsulation cover plate and the base substrate; the first sealant is at a side, which faces the base substrate, of the encapsulation cover plate, and the first sealant comprises a plurality of portions which are spaced apart with each other; the second sealant covers the organic light emitting diode device and at least a portion of the first sealant so that the organic light emitting diode device is sealed.

For example, the second sealant is continuously distributed and is an integral structure.

For example, a thickness of the first sealant is not more than ⅔ of a thickness of the second sealant.

For example, the first sealant includes a filling material.

For example, the filling material comprises at least one of a moisture absorbing material, a heat dissipating material and an oxygen absorbing material.

For example, the plurality of portions of the first sealant is on the encapsulation cover plate and exactly face the organic light emitting diode device.

For example, a shape of each of the plurality of portions of the first sealant is a dot or a strip.

For example, the organic light emitting diode encapsulation structure further comprises: a frame sealant between the base substrate and the encapsulation cover plate and bonding the base substrate and the encapsulation cover plate.

At least one embodiment of the present disclosure further provides an organic light emitting diode display apparatus, and the organic light emitting diode display apparatus comprises the organic light emitting diode encapsulation structure provided by any one of the embodiments of the present disclosure.

At least one embodiment of the present disclosure further provides an encapsulation method of an organic light emitting diode, and the method comprises: providing an encapsulation cover plate and a base substrate provided with an organic light emitting diode device; forming a first sealant on a first surface of the encapsulation cover plate, in which the first sealant comprises a plurality of protrusion portions which are spaced apart with each other; forming a second sealant on the first surface of the encapsulation cover plate, in which the second sealant comprises a plurality of protrusion portions and a height of each of the plurality of protrusion portions of the second sealant in a direction perpendicular to the encapsulation cover plate is greater than a height of each of the plurality of protrusion portions of the first sealant in the direction perpendicular to the encapsulation cover plate; bonding the encapsulation cover plate and the base substrate, in which the second sealant covers the organic light emitting diode device and at least a portion of the first sealant so that the organic light emitting diode device is sealed.

For example, the encapsulation method of the organic light emitting diode further comprises: forming a frame sealant in a peripheral region of the encapsulation cover plate.

For example, the encapsulation method of the organic light emitting diode further comprises: curing the first sealant, the second sealant and the frame sealant by the same cure process.

For example, a thickness of each of the plurality of protrusion portions of the first sealant is not more than ⅓ of a thickness of each of the plurality of protrusion portions of the second sealant.

For example, a number of the plurality of protrusion portions of the second sealant is greater than or equal to a number of the plurality of protrusion portions of the first sealant.

For example, the plurality of protrusion portions of the first sealant and the plurality of protrusion portions of the second sealant are evenly distributed on the encapsulation cover plate.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

REFERENCE NUMERALS

Figure 1:
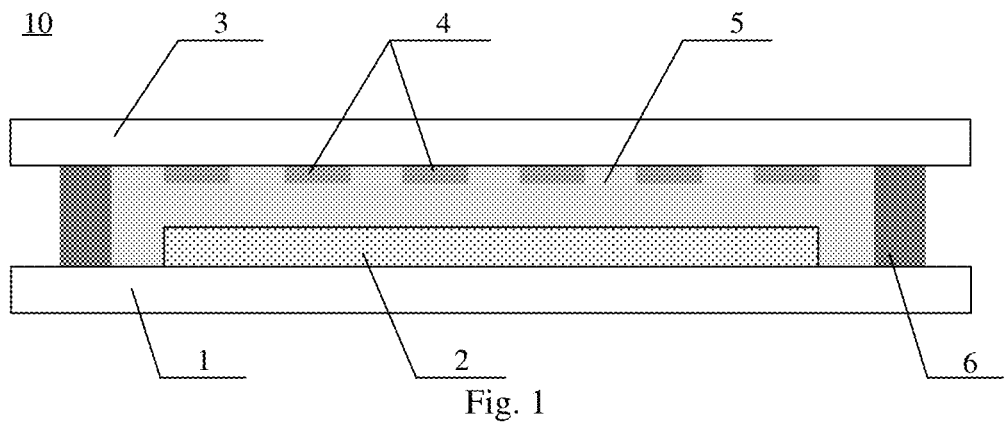
FIG. 1 is a cross-sectional schematic diagram of an organic light emitting diode encapsulation structure provided by at least one embodiment of the present disclosure.

1—base substrate; 2—organic light emitting diode device; 3—encapsulation cover plate; 301—a first surface of the encapsulation cover plate; 4—first sealant; 401—protrusion portions of the first sealant; 5—second sealant; 501—protrusion portions of the second sealant; 6—frame sealant; 10—organic light emitting diode encapsulation structure; 11—display apparatus.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "Inside," "outside," and the like are only used to indicate relative position relationship, and when the position of the object which is described is changed, the relative position relationship may be changed accordingly.

For the convenience of description, in the present disclosure, a first surface of the encapsulation cover plate is a surface, which is used to cover the organic light emitting diode device, of the encapsulation cover plate.

At least one embodiment of the present disclosure provides an organic light emitting diode encapsulation structure, and the organic light emitting diode encapsulation structure comprises a base substrate, an encapsulation cover plate, a first sealant and a second sealant. The base substrate is provided with an organic light emitting diode device; the encapsulation cover plate is opposite to the base substrate; both the first sealant and the second sealant are between the encapsulation cover plate and the base substrate; the first sealant is at a side, which faces the base substrate, of the encapsulation cover plate, and the first sealant comprises a plurality of portions which are spaced apart with each other; the second sealant covers the organic light emitting diode device and at least a portion of the first sealant so that the organic light emitting diode device is sealed.

Figure 2A:
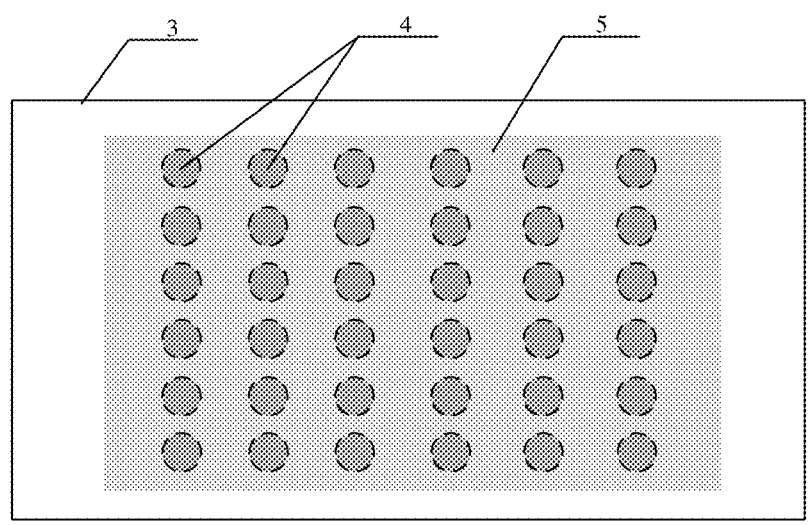
FIG. 2A is a plane schematic diagram of an encapsulation cover plate, coated with a sealant, of the organic light emitting diode encapsulation structure provided by at least one embodiment of the present disclosure.
Figure 2B:
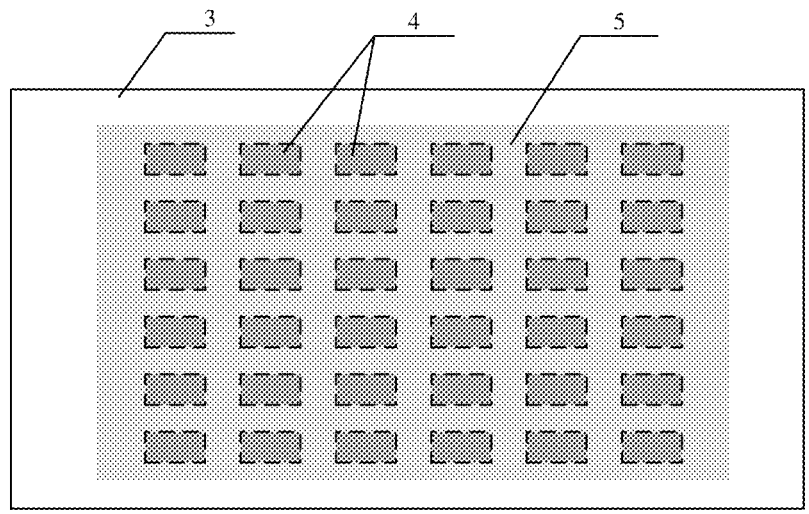
FIG. 2B is another plane schematic diagram of the encapsulation cover plate, coated with the sealant, of the organic light emitting diode encapsulation structure provided by at least one embodiment of the present disclosure.

FIG. 1 is a cross-sectional schematic diagram of an organic light emitting diode encapsulation structure provided by at least one embodiment of the present disclosure, FIG. 2A is a plane schematic diagram of an encapsulation cover plate, coated with a sealant, of the organic light emitting diode encapsulation structure provided by at least one embodiment of the present disclosure, FIG. 2B is another plane schematic diagram of the encapsulation cover plate, coated with the sealant, of the organic light emitting diode encapsulation structure provided by at least one embodiment of the present disclosure.

For example, as illustrated in FIG. 1, an organic light emitting diode encapsulation structure 10 comprises a base substrate 1, an encapsulation cover plate 3, a first sealant 4 and a second sealant 5. The base substrate 1 is provided with an organic light emitting diode device 2, for example, the organic light emitting diode device 2 comprises an anode on the base substrate 1, an organic light emitting layer on the anode and a cathode on the organic light emitting layer, or the organic light emitting diode device 2 comprises the cathode on the base substrate 1, the organic light emitting layer on the cathode and the anode on the organic light emitting layer. The organic light emitting diode device for example further includes other organic functional materials, such as an electron injection layer, a hole injection layer, an electron transmission layer, a hole transmission layer, etc. The organic light emitting diode device 2 for example is a type of top-emitting, a type of bottom-emitting or a type of double-side-emitting, and no limitation is imposed on the specific structure or type of the organic light emitting diode device. The base substrate for example is a substrate of various types, such as a glass substrate, a plastic substrate, a quartz substrate, etc.

The encapsulation cover plate 3 is opposite to the base substrate 1, and the encapsulation cover plate for example is a substrate of various types, such as a glass substrate, a plastic substrate, a quartz substrate, etc. The first sealant 4 and the second sealant 5 are between the encapsulation cover plate 3 and the base substrate, and the first sealant 4 is at a side, which faces the base substrate 1, of the encapsulation cover plate 3, and the first sealant 4 comprises a plurality of portions which are spaced apart with each other. For example, in the structure illustrated in FIG. 1, the second sealant 5 is between the first sealant 4 and the organic light emitting diode device 2, the second sealant 5 completely covers the first sealant 4 and the organic light emitting diode device 2, so that the organic light emitting diode device 2 is sealed, and the structure illustrated in FIG. 1 not only achieves sealing of the organic light emitting diode device 2, but also simplify an encapsulation process. Of course, in other embodiments of the present disclosure, the second sealant 5 for example covers a portion of the first sealant 4, as long as the first sealant 4 is separated apart from the organic light emitting diode device 2 by the second sealant 5.

For example, the first sealant 4 and the second sealant 5 comprise various appropriate sealants, for example, the first sealant 4 and the second sealant 5 comprise ultraviolet curing resins, such as free radical ultraviolet curing resins (such as epoxy acrylic resins, polyurethane acrylic resins, polyester acrylic resins, etc.), or the first sealant 4 and the second sealant 5 comprise cationic light curing resins (such as epoxy resins, vinyl ether resins, etc.). The first sealant 4 and the second sealant 5 for example are heat curing sealants, such as additive silicone. Of course, the first and second sealants are not limited to the types listed above.

For example, the first sealant 4 comprises a filling material doped in it, and for example, the filling material comprise at least one of a moisture absorbing material, a heat dissipating material and an oxygen absorbing material. Many organic light emitting materials contained in the organic light emitting device are easy to react with water and oxygen, which affects performances of the organic light emitting device, oxidation of a metal electrode of the organic light emitting device causes a degradation of functions of the organic light emitting device, and the organic light emitting materials cannot endure a high temperature, thus adding the moisture absorbing material, the oxygen absorbing material and/or the heat dissipating material in the first sealant 4 protects the organic light emitting diode device and prolongs a life of the organic light emitting diode device. For example, the moisture absorbing material is a desiccant such as quicklime (CaO) or a water absorbing resin; for example, the oxygen absorbing material is an inorganic oxygen absorbing agent such as metal powder (including iron powder, copper powder, etc.), a mixture of sodium sulphate and iron powder, sodium bisulfite, etc., or the oxygen absorbing material is an organic oxygen absorbing agent, such as dibutylhydroxymethyl anisole (BHA), bishydroxymethyl ether (BHT), etc.; for example, the heat dissipating material is a heat conducting lipid. For example, the heat dissipating material includes heat dissipating particles made of zinc oxide, alumina or boron nitride. Of course, in at least one embodiment of the present disclosure, the filling material included in the first sealant 4 is not limited to the above-mentioned three materials which are the moisture absorbing material, the oxygen absorbing material and the heat dissipating material, and may further include other materials beneficial to protecting the organic light emitting device 2. The above-mentioned three materials are not limited to the types listed, no limitation is imposed to types of the filling material in embodiments of the present disclosure.

In the structure illustrated in FIG. 1, the above-mentioned filling material added in the first sealant 4 prevents water vapor, oxygen and heat from intruding through a gap into the organic light emitting diode device 2; however, the filling material is usually a granular material, the filling material has an adverse effect on the organic light emitting diode device 2 if the filling material directly contacts with the organic light emitting diode device 2. Therefore, for example, the second sealant 5 does not include the filling material. In this case, the second sealant 5 covers the first sealant 4 and the organic light emitting diode device 2, which prevents the filling material in the first sealant 4 from contacting with the organic light emitting diode device 2, thus the organic light-emitting diode device 2 is prevented from being damaged by the water vapor, the oxygen, the heat and the filling material, so that the life of the organic light emitting diode device 2 is prolonged.

In at least one embodiment of the present disclosure, the first sealant 4 includes the plurality of portions which are spaced apart with each other. Compared with a conventional structure formed by coating the first sealant 4 on a whole surface of a substrate, the structure of the embodiments of the present disclosure is simple and novel, and simplifies the encapsulation process of the organic light emitting diode. As illustrated in FIG. 2A and FIG. 2B, for example, the first sealant 4 is evenly distributed on the encapsulation cover plate 3, which provides a uniform protection of all parts of the organic light emitting diode device. For example, as illustrated in FIG. 2A, a shape of each of the plurality of portions of the first sealant 4 is a dot. For example, as illustrated in FIG. 2B, the shape of each of the plurality of portions of the first sealant 4 is a strip.

For example, as illustrated in FIG. 1, FIG. 2A and FIG. 2B, the second sealant 5 is continuously distributed and is an integral structure. For example, the second sealant 5 is filled between the encapsulation cover plate 3 and the organic light emitting diode device 2, and the second sealant 5 is the integral structure covering at least a portion of a surface, which faces the organic light emitting diode device 2, of the encapsulation cover plate 3. In this way, not only sealing gaps are reduced, but also a better sealing effect of the second sealant 5 on the organic light emitting diode device 2 is realized. At the same time, the first sealant 4 is blocked more tightly from contacting the organic light emitting diode device 2.

It should be noted that in order to make the contents of the present disclosure better understood, the embodiments illustrated FIG. 2A and FIG. 2B are only two examples of a pattern of the first sealant and a pattern of the second sealant, and the pattern of the first sealant and the pattern of the second sealant are not limited to the patterns illustrated in FIG. 2A and FIG. 2B. For example, in other embodiments of the present disclosure, the shape of each of the plurality of portions of the first sealant is a regular round dot, elliptic dot, or an irregular dot, a regular strip (for example, a circle strip, an arc strip, etc.) or an irregular strip. For example, the pattern of the second sealant is not the regular rectangle as illustrated in FIG. 2A and FIG. 2B. No limitation is imposed to the specific shapes of the plurality of portions of the first sealant and the specific shape of the second sealant in the present disclosure.

For example, a thickness of the first sealant 4 is not more than ⅔ of a thickness of the second sealant 5, so that it is easy to complete the encapsulation structure in which the integral second sealant 5 covers the plurality of portions of the first sealant 4 during the encapsulation process. Moreover, the thickness of the second sealant 5 is apparently larger than that of the first sealant 4, which better prevents external adverse factors and the filling material in the first sealant 4 from intruding into the organic light emitting diode device.

For example, as illustrated in FIG. 1, the plurality of portions of the first sealant 4 are on the encapsulation cover plate 3 and exactly face the organic light emitting diode device 2. Because the first sealant 4 contains the above-mentioned filling material, it is advantageous for the first sealant 4 to absorb the water vapor and the oxygen which intrude through a gap between a portion, which is exactly above the organic light emitting diode device 2, of the encapsulation cover plate 3 and the organic light emitting diode device 2, so that a more effective protection effect is realized.

For example, as illustrated in FIG. 1, the organic light emitting diode encapsulation structure 10 further includes a frame sealant 6. The frame sealant 6 is between the base substrate 1 and the encapsulation cover plate 3, and the base substrate 1 and the encapsulation cover 3 are bonded with each other by the frame sealant 6. The frame sealant 6, the base substrate 1 and the encapsulation cover 3 form a closed space, and the first sealant 4, the second sealant 5 and the organic light emitting diode device 2 are sealed in the closed space, so that shock and dust are prevented. For example, the frame sealant also includes the above filling material, which thus plays a role of anti-water, anti-oxygen, heat dissipation and so on. For example, the frame sealant includes various suitable organic adhesives (such as epoxy) and/or inorganic adhesives (such as glass adhesive). In addition, the frame sealant of the organic light emitting diode encapsulation structure is not limited to a single layer, for example, the frame sealant of the organic light emitting diode encapsulation structure comprises a composite layer of an organic sealant layer and an inorganic sealant layer.

At least one embodiment of the present disclosure provides an organic light-emitting diode display apparatus which includes any organic light-emitting diode encapsulation structure provided by at least one embodiment of the present embodiment.

Figure 2C:
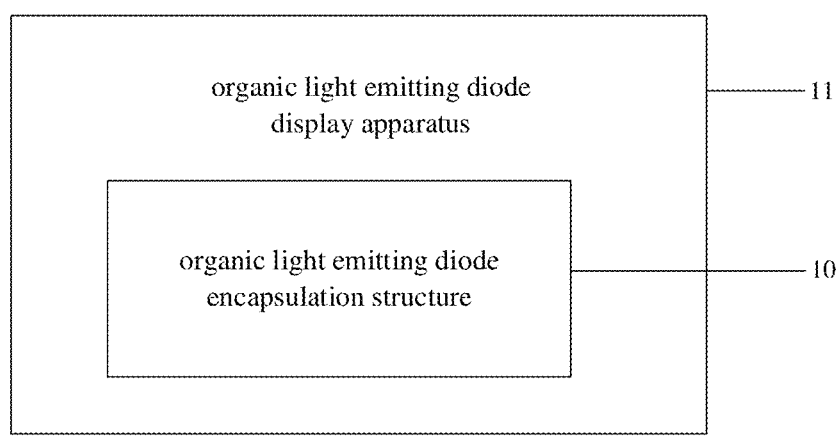
FIG. 2C is a schematic diagram of an organic light emitting diode display apparatus provided by at least one embodiment of the present disclosure.

For example, FIG. 2C is a schematic diagram of an organic light emitting diode display apparatus provided by at least one embodiment of the present disclosure. As illustrated in FIG. 2C, the organic light emitting diode display apparatus 11 includes any organic light emitting diode encapsulation structure 10 provided by at least one embodiment of the present disclosure. No limitation is imposed to other structures of the organic light-emitting diode display apparatus 11 in the embodiments of the present disclosure, and those skilled in the art may design other structures of the organic light-emitting diode display apparatus referring to common techniques.

For example, the organic light emitting diode display apparatus 11 is implemented as any product or component having a display function such as a mobile phone, a tablet computer, a television, a display, a notebook computer, a digital photo frame, a navigator, or the like.

At least one embodiment of the present disclosure provides an encapsulation method of an organic light emitting diode, and the encapsulation method of the organic light emitting diode includes: providing an encapsulation cover plate and a base substrate provided with an organic light emitting diode device; forming a first sealant on a first surface of the encapsulation cover plate, in which the first sealant comprises a plurality of protrusion portions which are spaced apart with each other; forming a second sealant on the first surface of the encapsulation cover plate, in which the second sealant comprises a plurality of protrusion portions and a height of each of the plurality of protrusion portions of the second sealant in a direction perpendicular to the encapsulation cover plate is greater than a height of each of the plurality of protrusion portions of the first sealant in the direction perpendicular to the encapsulation cover plate; and bonding the encapsulation cover plate and the base substrate, in which the second sealant covers the organic light emitting diode device and at least a portion of the first sealant so that the organic light emitting diode device is sealed. The encapsulation method of the organic light emitting diode provided in the present disclosure embodiment is applicable to the organic light emitting diode encapsulation structure provided by at least one embodiment of the present disclosure, such as the organic light emitting diode encapsulation structure illustrated in FIG. 1.

In the encapsulation method of the organic light emitting diode provided by at least one embodiment of the present disclosure, for example, the first sealant including the plurality of protrusion portions which are spaced apart with each other and the second sealant including the plurality of protrusion portions are formed on the first surface of the encapsulation cover plate. For example, a coating device equipped with a nozzle at which a sealant output amount is adjustable, such as a coating machine, is used to form the plurality of protrusion portions of the first sealant and the plurality of protrusion portions of the second sealant. By adjusting a size of the nozzle and parameters related to the sealant output amount and choosing an appropriate sealant and an appropriate sealant output amount, the height of each of the protrusion portions of the first sealant and the height of each of the protrusion portions of the second sealant are controlled. For example, a method of dot coating is used.

For example, the plurality of protrusion portions of the first sealant 4 are formed on the first surface 301 of the encapsulation cover plate 3 as illustrated in FIG. 1, and then the plurality of protrusion portions of the second sealant 5 are formed. For example, the plurality of protrusion portions of the second sealant 5 are formed first, and then the plurality of protrusion portions of the first sealant 4 are formed. In the following, the encapsulation method of the organic light emitting diode is described by taking that the plurality of protrusion portions of the first sealant 4 are formed first, and then the plurality of protrusion portions of the second sealant 5 are formed as an example.

Figure 3A:
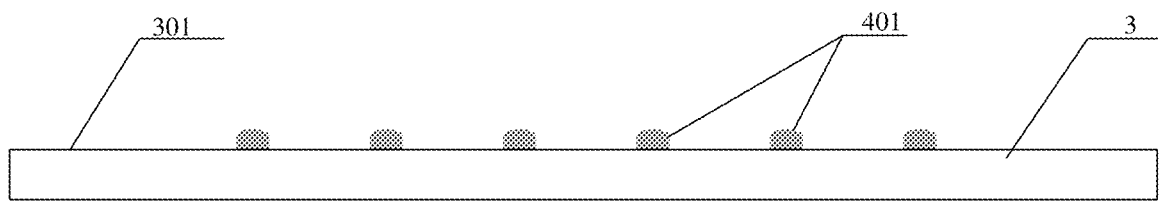
FIG. 3A-3F are cross-sectional schematic diagrams of an encapsulation method of an organic light emitting diode provided by at least one embodiment of the present disclosure.
Figure 3B:
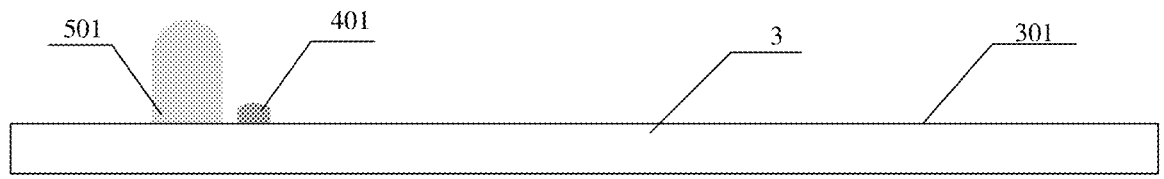
Figure 3C:
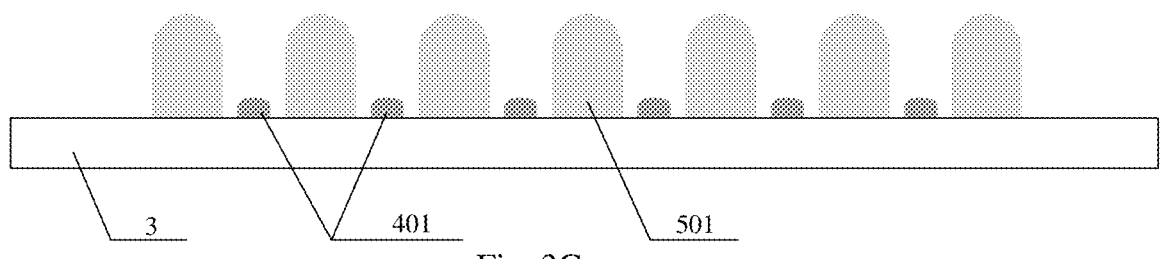
Figure 3D:
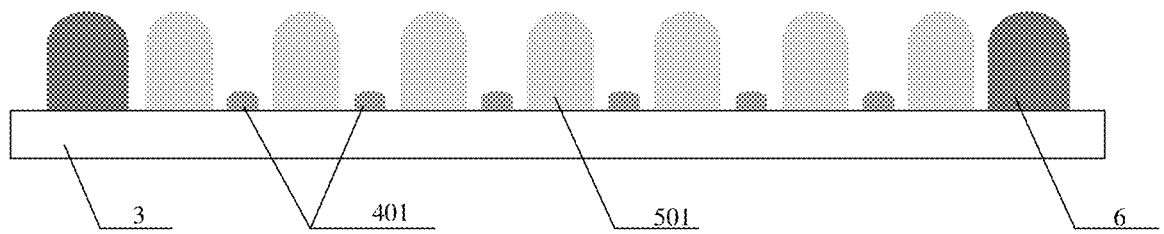
Figure 3E:
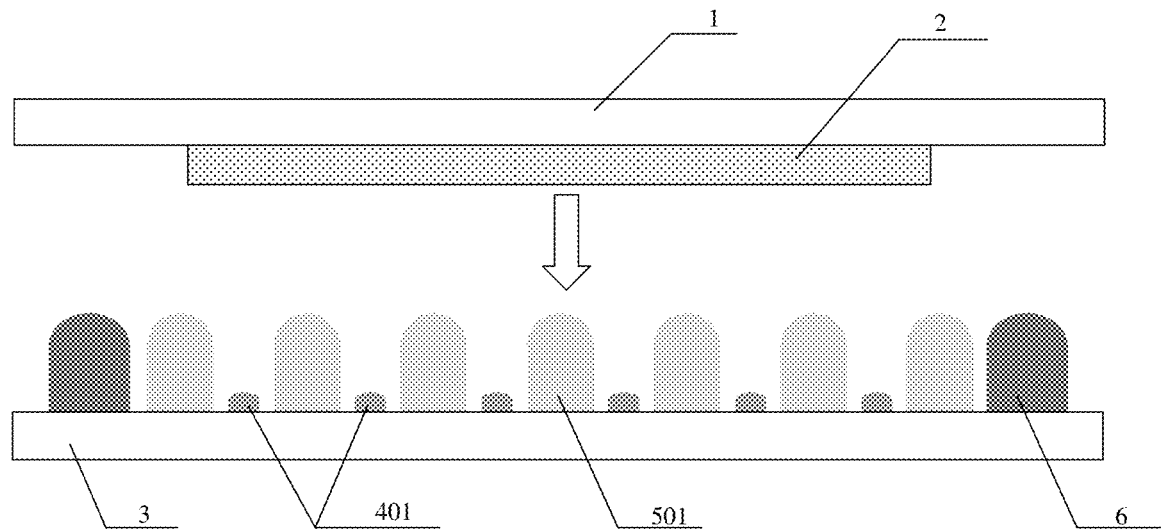
Figure 3F:
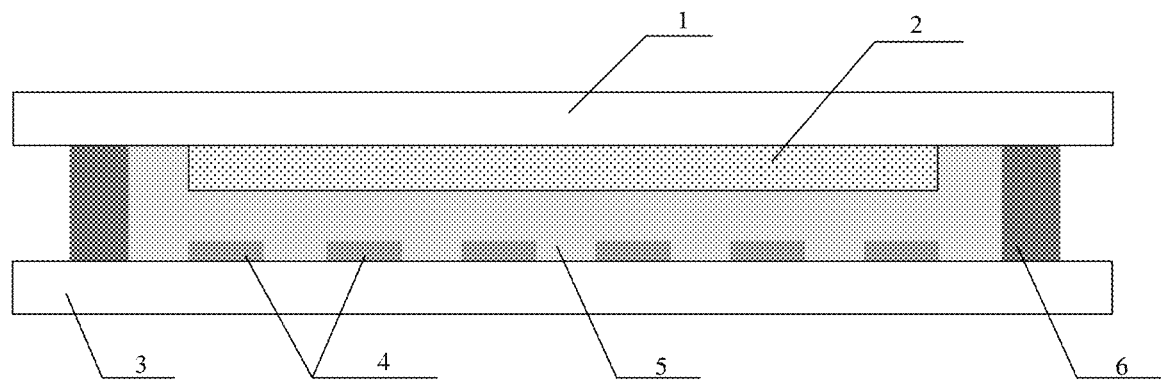
Figure 4A:
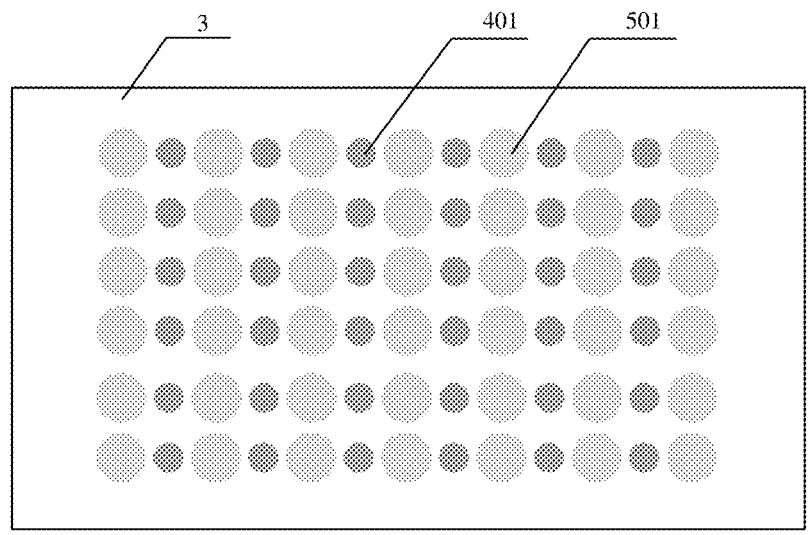
FIG. 4A is a plane schematic diagram of an encapsulation cover plate provided with a sealant before being bonded provided by at least one embodiment of the present disclosure.
Figure 4B:
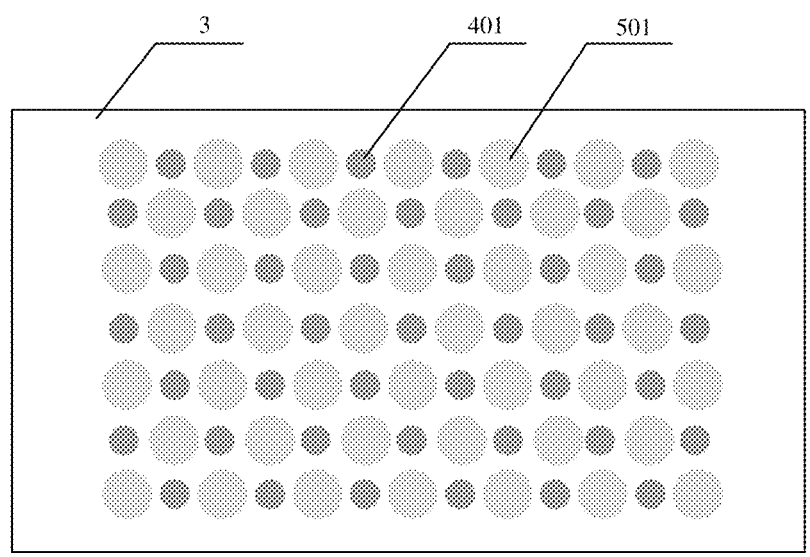
FIG. 4B is another plane schematic diagram of the encapsulation cover plate provided with the sealant before being bonded provided by at least one embodiment of the present disclosure.
Figure 4C:
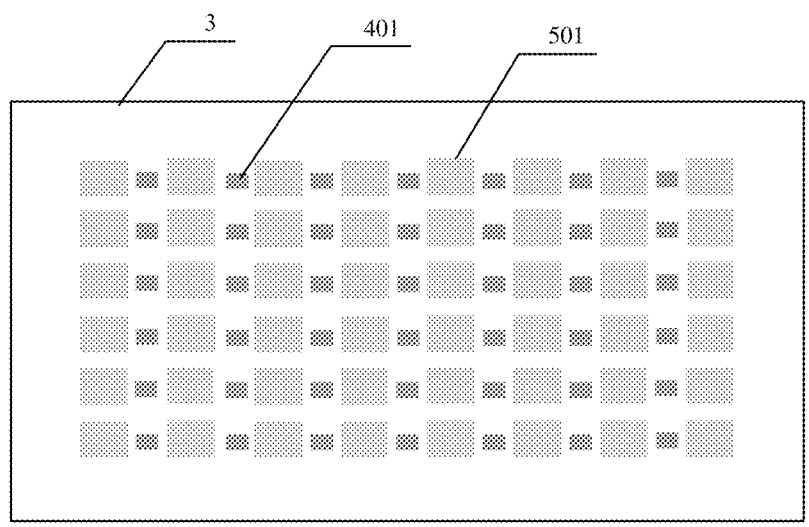
FIG. 4C is further another plane schematic diagram of the encapsulation cover plate provided with the sealant before being bonded provided by at least one embodiment of the present disclosure.

FIG. 3A-3F are cross-sectional schematic diagrams of an encapsulation method of an organic light emitting diode in at least one embodiment of the present disclosure, FIG. 4A is a plane schematic diagram of an encapsulation cover plate provided with a sealant before being bonded in at least one embodiment of the present disclosure, FIG. 4B is another plane schematic diagram of the encapsulation cover plate provided with the sealant before being bonded in at least one embodiment of the present disclosure, and FIG. 4C is further another plane schematic diagram of the encapsulation cover plate provided with the sealant before being bonded in at least one embodiment of the present disclosure.

As illustrated in FIG. 3A, the encapsulation cover plate 3 is provided, and a suitable size and suitable parameters of the nozzle are set before a coat process is carried out by controlling the nozzle to operate according to preset positions, so that the plurality of protrusion portions of the first sealant 4 are formed one by one.

As illustrated in FIG. 3C, after the plurality of protrusion portions of the first sealant 4 are formed, the plurality of protrusion portions of the second sealant 5 are formed on the first surface 301 of the encapsulation cover plate 3, for example, the height of each of the protrusion portions of the second sealant 5 is larger than the height of each of the protrusion portions of the first sealant 4. For example, the size and the parameters related to the sealant output amount are adjusted and a sealant output amount greater than that used during forming the first sealant 4 is chosen, in order to realize that the height of each of the protrusion portions of the second sealant 5 is greater than the height of each of the protrusion portions of the first sealant 4. Then, the second sealant 5 is coated, and for example, the protrusion portions of the second sealant 5 are formed on the first surface 301 of the encapsulation cover plate 3 one by one.

For example, FIG. 3B provides another example of the protrusion portions of the first sealant and the protrusion portions of the second sealant. For example, the protrusion portions of the first sealant are formed, simultaneously, the protrusion portions of the second sealant are formed, and each of the protrusion portions of the second sealant is adjacent to and is simultaneously formed with one of the protrusion portions of the first sealant. For example, the coating device equipped with a plurality of nozzles at which the sealant output amount is adjustable is used to form the plurality of protrusion portions of the first sealant and the plurality of protrusion portions of the second sealant by coating. For example, as illustrated in FIG. 3B, in a case where two nozzles operate simultaneously, a first nozzle is used to form the plurality of protrusion portions 401 of the first sealant and a second nozzle is used to form the plurality of protrusion portions 501 of the second sealant. The size and the parameters related to the sealant output amount of the two nozzles are adjusted respectively first, and then the two nozzles are controlled to operate at the same time according to preset positions. While each of the protrusion portions of the first sealant is formed, one protrusion portion of the second sealant is formed simultaneously with and adjacent to the each of the protrusion portions of the first sealant. Thus, the plurality of protrusion portions 401 of the first sealant and the plurality of protrusion portions 501 of the second sealant as illustrated in FIG. 3C are formed simultaneously. Compared with the method illustrated in FIG. 3A, the process illustrated in FIG. 3B-3C is simpler, easier to operate and has a higher coating efficiency. It should be noted that the coating equipment adopted in the embodiments of the present disclosure is not limited to a case that two nozzles are controlled to work simultaneously, for example, the coating equipment controls more than two nozzles to work simultaneously, so that the coating efficiency is further improved.

For example, in the above-mentioned method of forming the first sealant and the second sealant, the height of each of the protrusion portions of the first sealant is not greater than ⅓ of the height of each protrusion portions of the second sealant, which for example is realized by respectively adjusting the size and the parameters related to the sealant output amount of each nozzle used to form the plurality of protrusion portions of the first sealant and each nozzle used to form the plurality of protrusion portions of the second sealant. In this way, the first sealant is more tightly covered by the second sealant after bonding the base substrate and the encapsulation cover plate, so that the first sealant is better blocked from contacting the organic light emitting diode device. At the same time, the height of each of the protrusion portions of the second sealant is greater, so that the organic light emitting diode device is covered by the second sealant more tightly, and the sealing effect is better.

For example, in addition to the method of adopting the coating machine mentioned above, an inkjet printing device with one or more nozzles at which the sealant output amount is adjustable is used to form the protrusion portions of the first sealant and the protrusion portions of the second sealant. No limitation is imposed to a type of the device used to form the sealant in the embodiments of the present disclosure.

It should be noted that the coating device or the inkjet printing device for example is provided with a control device. For example, the coating work of the nozzle is controlled. For example, the control device controls operations of the nozzle, for example, the control device is a central processing unit, a programmable logic controller (PLC), a single chip computer, etc. The position of the nozzle of the coating device is programmably controlled to form the protrusion portions of the first sealant and the protrusion portions of the second sealant as required.

For example, a number of the plurality of protrusion portions of the second sealant 5 is greater than or equal to a number of the plurality of protrusion portions of the first sealant 4. As illustrated in FIG. 4A-4C, at least one protrusion portion 501 of the second sealant is formed adjacent to each of the protrusion portions 401 of the first sealant, so that the first sealant is more tightly covered by the second sealant after bonding the base substrate and the encapsulation cover plate, thereby the first sealant is blocked from the organic light emitting diode device better.

For example, as illustrated in FIG. 4A-4C, the plurality of protrusion portions 401 of the first sealant and the plurality of protrusion portions 501 of the second sealant are evenly distributed on the first surface 301 of the encapsulation cover plate 3, which is beneficial to forming an evenly distributed sealant layer, and the evenly distributed sealant layer provides a uniform protection for all parts of the organic light emitting display device, so a better sealing protection effect is realized.

For example, a shape of each of the plurality of protrusion portions 401 of the first sealant and a shape of each of the plurality of protrusion portions 501 of the second sealant are a dot as illustrated in FIG. 4A and FIG. 4B or a strip as illustrated in FIG. 4C. The plurality of protrusion portions 401 of the first sealant and the plurality of protrusion portions 501 of the second sealant are in an alternate distribution. The plurality of protrusion portions 401 of the first sealant is alternated with the plurality of protrusion portions 501 of the second sealant in a row direction as illustrated in FIG. 4A, or in the row direction and in a column direction as illustrated in FIG. 4B.

It should be noted that the embodiments illustrated in FIG. 4A-4C are only three examples of the encapsulation cover plate provided with the first sealant and the second sealant before bonding the base substrate and the encapsulation cover plate. The arrangement way of the first sealant and the second sealant is not limited to those illustrated in FIG. 4A-4C. The shape of each of the plurality of protrusion portions 401 of the first sealant and the shape of each of the plurality of protrusion portions 501 of the second sealant are not limited to the regular round dot as illustrated in FIG. 4A-4B or the regular rectangle strip as illustrated in FIG. 4C or irregular rectangle strip. For example, in other embodiments of the present disclosure, the shape of each of the plurality of protrusion portions 401 of the first sealant and the shape of each of the plurality of protrusion portions 501 of the second sealant are a regular elliptic dot, an irregular dot, an irregular strip, etc. No limitation is imposed to the specific shapes of plurality of portions of the first sealant and the specific shapes of the plurality of portions of the second sealant in the present disclosure.

For example, after the first sealant and the second sealant are formed, a frame sealant is formed in a peripheral region of the encapsulation cover plate. As illustrated in FIG. 3D, one or more layers of the frame sealant 6 are formed in the peripheral region of the first surface of the encapsulation cover plate 3. For example, the frame sealant 6 is formed by a method of coating using a coating machine or a method of inkjet printing. For example, the frame sealant 6 provides along a whole circumference of the first surface of the encapsulation cover plate 3.

For example, as illustrated in FIG. 3E, the base substrate 1 provided with the organic light emitting diode device 2 is opposed to the encapsulation cover plate 3 provided with the plurality of protrusion portions 401 of the first sealant, the plurality of protrusion portions 501 of the second sealant and the frame sealant 6, and the surface of the base substrate 1 provided with the organic light emitting diode device 2 faces the encapsulation cover plate 3, then the base substrate 1 and the encapsulation cover plate 3 are bonded with each other in a vacuum environment or an environment of inert gases. After the base substrate 1 and the encapsulation cover plate 3 are bonded, the organic light emitting diode (OLED)

encapsulation structure as illustrated in FIG. 3F is formed. As illustrated in FIG. 3F, the plurality of protrusion portions 401 of the first sealant before bonding are covered by the plurality of protrusion portions 501 of the second sealant, and the plurality of protrusion portions 501 of the second sealant are connected together to come into an integral structure to form the second sealant which is continuously distributed, so that the second sealant covers the organic light emitting diode device 2 and the organic light emitting diode device 2 is sealed. Meanwhile, the first sealant 4 is prevented from contacting with the organic light emitting diode, and a damage to the organic light emitting diode device 2 caused by contacting of the filling material included in the first sealant 4 and the organic light emitting diode device 2 is avoided.

After the base substrate 1 and the encapsulation cover plate 3 are bonded, the first sealant, the second sealant and the frame sealant are cured. The first sealant, the second sealant and the frame sealant are cured by a same cure process. For example, an ultraviolet irradiation curing method or a heating curing method is adopted. No limitation is imposed to the specific curing method in the embodiments of the present disclosure, the specific curing method may be determined according to types and properties of the first sealant, the second sealant and the frame sealant. As for the materials of the first sealant, the second sealant and the frame sealant may be referred to the above-mentioned descriptions.

Generally, in a process of encapsulating the organic light emitting diode device, in order to avoid a damage to the organic light emitting diode device caused by the filling material added in the sealant, a common solution is forming a double-layer sealant protection structure. A first layer of sealant containing the filling material is coated on a side, which is used to cover the organic light emitting diode device, of an encapsulation cover plate, and after curing the first layer of sealant, a second layer of sealant is coated, then the encapsulation cover plate and a base substrate provided with the organic light emitting diode device are bonded, and then the second layer of sealant is cured. Both the two layers of sealants need to be coated on a whole surface of the encapsulation cover plate by an equipment having a function of coating on the whole surface, and this encapsulation process requires two coatings steps and two curing steps, thus the process is complex and the coating method of sealants is limited. In the encapsulation method provided by at least one embodiment of the present disclosure, although the first sealant and the second sealant are adopted, the curing of the first sealant and the second sealant is completed by only one curing process. Therefore, the encapsulation method of the organic light emitting diode provided by at least one the embodiment of the present disclosure reduces an amount of curing times in a whole encapsulation process, simplifies an encapsulation process and improves an encapsulation efficiency. Moreover, forming the sealant does not require a coating device with a function of coating a whole surface, so that methods of forming the sealant and coating device adopted are diversified.

What is described above is related to the illustrative embodiments of the disclosure only and not limitative to the scope of the disclosure; the scopes of the disclosure are defined by the accompanying claims.

What is claimed is:

1. An organic light emitting diode encapsulation structure, comprising:
    a base substrate provided with an organic light emitting diode device;
    an encapsulation cover plate opposite to the base substrate; and
    a first sealant and a second sealant,
    wherein both the first sealant and the second sealant are between the encapsulation cover plate and the base substrate; the first sealant is at a side, which faces the base substrate, of the encapsulation cover plate, and the first sealant comprises a plurality of portions which are spaced apart with each other; the second sealant covers the organic light emitting diode device and at least a portion of the first sealant so that the organic light emitting diode device is sealed;
    the second sealant is an integral structure which is continuously distributed, the second sealant covers all surfaces, which do not contact the encapsulation cover plate, of the plurality of protrusion portions of the first sealant, and at least a portion of the second sealant is between the first sealant and the organic light emitting diode device, so that the first sealant is spaced apart from the organic light emitting diode device by the second sealant;
    the first sealant includes a filling material, the filling material comprises at least one selected from a group consisting of a moisture absorbing material, a heat dissipating material and an oxygen absorbing material, and the second sealant does not include the filling material.

2. The organic light emitting diode encapsulation structure according to claim 1, wherein a thickness of the first sealant is not more than ⅔ of a thickness of the second sealant.

3. The organic light emitting diode encapsulation structure according to claim 1, wherein the plurality of portions of the first sealant are on the encapsulation cover plate and exactly face the organic light emitting diode device.

4. The organic light emitting diode encapsulation structure according to claim 1, wherein a shape of each of the plurality of portions of the first sealant is a dot or a strip.

5. The organic light emitting diode encapsulation structure according to claim 1, further comprising:
    a frame sealant between the base substrate and the encapsulation cover plate and bonding the base substrate and the encapsulation cover plate.

6. An organic light emitting diode display apparatus, comprising the organic light emitting diode encapsulation structure according to claim 1.

7. An encapsulation method of an organic light emitting diode, comprising:
    providing an encapsulation cover plate and a base substrate provided with an organic light emitting diode device;
    forming a first sealant on a first surface of the encapsulation cover plate, wherein the first sealant comprises a plurality of protrusion portions which are spaced apart with each other;
    forming a second sealant on the first surface of the encapsulation cover plate, wherein the second sealant comprises a plurality of protrusion portions and a height of each of the plurality of protrusion portions of the second sealant in a direction perpendicular to the encapsulation cover plate is greater than a height of each of the plurality of protrusion portions of the first sealant in the direction perpendicular to the encapsulation cover plate;
    bonding the encapsulation cover plate and the base substrate, wherein the second sealant covers the organic light emitting diode device and at least a portion of the first sealant so that the organic light emitting diode device is sealed;

forming a frame sealant in a peripheral region of the encapsulation cover plate; and curing the first sealant, the second sealant and the frame sealant by a same cure process.

8. The encapsulation method of the organic light emitting diode according to claim 7, wherein a thickness of each of the plurality of protrusion portions of the first sealant is not more than ⅓ of a thickness of each of the plurality of protrusion portions of the second sealant.

9. The encapsulation method of the organic light emitting diode according to claim 7, wherein a number of the plurality of protrusion portions of the second sealant is greater than or equal to a number of the plurality of protrusion portions of the first sealant.

10. The encapsulation method of the organic light emitting diode according to claim 7, wherein the plurality of protrusion portions of the first sealant and the plurality of protrusion portions of the second sealant are evenly distributed on the encapsulation cover plate.

11. The encapsulation method of the organic light emitting diode according to claim 7, wherein after the encapsulation cover plate and the base substrate are bonded, the plurality of protrusion portions of the second sealant are connected together to come into an integral structure to form the second sealant which is continuously distributed, and the plurality of protrusion portions of the first sealant are covered by the second sealant which is continuously distributed.

12. The encapsulation method of the organic light emitting diode according to claim 7, wherein after the encapsulation cover plate and the base substrate are bonded, at least a portion of the second sealant is between the first sealant and the organic light emitting diode device, so that the first sealant is spaced apart from the organic light emitting diode device by the second sealant.

13. The encapsulation method of the organic light emitting diode according to claim 7, wherein after the encapsulation cover plate and the base substrate are bonded, the second sealant covers surfaces, which do not contact the encapsulation cover plate, of the plurality of protrusion portions of the first sealant, and the second sealant contacts the surfaces, which do not contact the encapsulation cover plate, of the first sealant.

14. The encapsulation method of the organic light emitting diode according to claim 7, wherein the first sealant includes a filling material, the filling material comprises at least one selected from a group consisting of a moisture absorbing material, a heat dissipating material and an oxygen absorbing material, and the second sealant does not include the filling material.

15. An encapsulation method of an organic light emitting diode, comprising:

providing an encapsulation cover plate and a base substrate provided with an organic light emitting diode device;

forming a first sealant on a first surface of the encapsulation cover plate, wherein the first sealant comprises a plurality of protrusion portions which are spaced apart with each other;

forming a second sealant on the first surface of the encapsulation cover plate, wherein the second sealant comprises a plurality of protrusion portions and a height of each of the plurality of protrusion portions of the second sealant in a direction perpendicular to the encapsulation cover plate is greater than a height of each of the plurality of protrusion portions of the first sealant in the direction perpendicular to the encapsulation cover plate;

bonding the encapsulation cover plate and the base substrate, wherein the second sealant covers the organic light emitting diode device and at least a portion of the first sealant so that the organic light emitting diode device is sealed, wherein before the first sealant is cured, the second sealant is formed on the first surface of the encapsulation cover plate.

16. The encapsulation method of the organic light emitting diode according to claim 15, further comprising:

forming a frame sealant in a peripheral region of the encapsulation cover plate.

17. The encapsulation method of the organic light emitting diode according to claim 16, further comprising:

curing the first sealant, the second sealant and the frame sealant by a same cure process.

18. The encapsulation method of the organic light emitting diode according to claim 15, wherein after the encapsulation cover plate and the base substrate are bonded, at least a portion of the second sealant is between the first sealant and the organic light emitting diode device, so that the first sealant is spaced apart from the organic light emitting diode device by the second sealant.

19. The encapsulation method of the organic light emitting diode according to claim 18, wherein the second sealant covers all surfaces, which do not contact the encapsulation cover plate, of the plurality of protrusion portions of the first sealant.

20. The encapsulation method of the organic light emitting diode according to claim 15, wherein the first sealant includes a filling material, the filling material comprises at least one selected from a group consisting of a moisture absorbing material, a heat dissipating material and an oxygen absorbing material, and the second sealant does not include the filling material.

* * * * *